(12) United States Patent
Strobl

(10) Patent No.: US 11,594,570 B2
(45) Date of Patent: Feb. 28, 2023

(54) III-V SEMICONDUCTOR PIXEL X-RAY DETECTOR

(71) Applicant: AZUR SPACE Solar Power GmbH, Heilbronn (DE)

(72) Inventor: Gerhard Strobl, Stuttgart (DE)

(73) Assignee: AZUR SPACE Solar Power GmbH, Heilbronn (DE)

( * ) Notice: Subject to any disclaimer, the term of this patent is extended or adjusted under 35 U.S.C. 154(b) by 0 days.

(21) Appl. No.: 17/209,144

(22) Filed: Mar. 22, 2021

(65) Prior Publication Data

US 2021/0296391 A1    Sep. 23, 2021

(30) Foreign Application Priority Data

Mar. 20, 2020   (DE) ..................... 10 2020 001 839.4

(51) Int. Cl.
*H01L 27/146* (2006.01)
*G01T 1/24* (2006.01)

(52) U.S. Cl.
CPC .......... *H01L 27/14659* (2013.01); *G01T 1/24* (2013.01); *H01L 27/14605* (2013.01)

(58) Field of Classification Search
CPC ................... H01L 27/14605; H01L 27/14659; G01T 1/24
See application file for complete search history.

(56) References Cited

U.S. PATENT DOCUMENTS 7,217,324 B2     5/2007  Bourgoin
2008/0110489 A1*  5/2008  Sepehry-Fard ....... H01L 31/032
                                                         136/246

(Continued)

FOREIGN PATENT DOCUMENTS

DE           60221638 T2     5/2008
WO       WO2004081604 A2     9/2004

OTHER PUBLICATIONS

Erd et al. Hard X-ray test and evaluation of a prototype 32×32 pixel gallium-arsenide array, Nuclear Instruments and Methods in Physics Research A vol. 487, No. 1-2, pp. 78-89 (Year: 2002).*

(Continued)

*Primary Examiner* — Hugh Maupin
(74) *Attorney, Agent, or Firm* — Muncy, Geissler, Olds & Lowe, P.C.

(57) ABSTRACT

A III-V semiconductor pixel X-ray detector, including an absorption region of a first or a second conductivity type, at least nine semiconductor contact regions of the second conductivity type arranged in a matrix along the upper side of the absorption region, and optionally a semiconductor contact layer of the first conductivity type, a metallic front side connecting contact being arranged beneath the absorption region, and a metallic rear side connecting contact being arranged above each semiconductor contact region, and a semiconductor passivation layer of the first or the second conductivity type. The semiconductor passivation layer and the absorption region being lattice-matched to each other. The semiconductor passivation layer being arranged in regions on the upper side of the absorption region. The semiconductor passivation layer having a minimum distance of at least 2 μm or at least 20 μm with respect to each highly doped semiconductor contact region.

20 Claims, 3 Drawing Sheets

(56) References Cited

U.S. PATENT DOCUMENTS

| | | | |
|---|---|---|---|
| 2009/0045346 A1* | 2/2009 | Von Kanel | H01L 27/14689 250/370.09 |
| 2015/0372047 A1 | 12/2015 | Ni | |
| 2016/0307956 A1* | 10/2016 | Klipstein | H01L 31/02161 |
| 2017/0269237 A1* | 9/2017 | Cao | H01L 27/14634 |

OTHER PUBLICATIONS

Ng et al. Fabrication study of GaAs mesa diodes for X-ray detection, Journal of Instrumentation vol. 9 T08005, 9 pages (Year: 2014).*

V.F. Dvoryankin et al: "Multielement X-ray row detector on GaAs with spatial resoltion of 108 μm", Nuclear Instruments & Methods in Physics Research, Section A, Elsevier B.V, vol. 531, 2004, pp. 87-88.

G.C. Sun et al: "A method for adjusting the performances of epitaxial GaAs X-ray detectors" Nuclear Instruments & Methods in Physics Research, Section A, 2002, vol. 487, pp. 50-53.

J. C. Bourgoin et al: "GaAs Schottky versus p/i/n diodes for pixellated X-ray detectors" Nuclear Instruments & Methods in Physics Research, Section A, vol. 487, 2002, pp. 47-49.

G. M. Lezhneva et al: "GaAs Pixel-Detector Technology for X-ray Medical Imaging: a Review" Russian Microelectronics, vol. 34, No. 4, 2005, pp. 229-241.

Maria Rizzi et al: "GaAs X-Ray System Detectors for Medical Applications" Computer Science, pp. 1-6, at https://www.researchgate.net/publication/237780321 (2005).

\* cited by examiner

III-V SEMICONDUCTOR PIXEL X-RAY DETECTOR

This nonprovisional application claims priority under 35 U.S.C. § 119(a) to German Patent Application No. 10 2020 001 839.4, which was filed in Germany on Mar. 20, 2020 and which is herein incorporated by reference.

BACKGROUND OF THE INVENTION

Field of the Invention

The present invention relates to III-V semiconductor pixel X-ray detector.

Description of the Background Art

A method and a device for manufacturing a GaAs detector for detecting X-rays and an imaging are known from "A Method for Adjusting the Performance of Epitaxial GaAs X-Ray Detectors," Sun, G. C. and Bourgoin, J. C., Nucl. Instrum. Methods Phys. Res., Sect. A, 2003, vol. 512, pp. 355-360, from "GaAs Schottky Versus p/i/n Diodes for Pixelated X-Ray Detectors", Bourgoin, J. C. and Sun, G. C., Nucl. Instrum. Methods Phys. Res., Sect. A, 2002, vol. 487, pp. 47-49, likewise from DE 602 21 638 T2.

Another GaAs imaging device for detecting X-rays is furthermore known from WO 2004 816 04 A2.

P-i-n structures made from GaAs as pixels of an X-ray detector are also known from "GaAs Pixel Detector Technology for X-Ray Medical Imaging," Lezhneva et al., Russian Microelectronics, Vol. 34, No. 4, 2005, pp. 229-241, both epitaxially grown and implanted p+ contact regions being disclosed.

A Schottky diode-based X-ray detector on a GaAs base is known from "GaAs X-Ray System Detectors for Medical Applications", Rizzi et al., https://www.researchgate.net/publication/237780321.

The residual or leakage currents, which occur during an operation in the non-conducting direction, in particular via the edges of the planar p-n junctions or the mesa structures, are a disadvantage of the described structures.

SUMMARY OF THE INVENTION

It is therefore an object of the present invention to provide a device which refines the prior art.

According to the subject matter of the invention, a III-V semiconductor pixel X-ray detector is provided.

The III-V semiconductor pixel X-ray detector can have an absorption region of a first conductivity type, with an upper side and a lower side, as well as at least nine semiconductor contact regions of a second conductivity arranged in a matrix along an upper side of the absorption region and having a first energy gap.

The III-V semiconductor pixel X-ray detector also comprises a metallic front side connecting contact arranged beneath the underside of the absorption region and a metallic rear side connecting contact arranged above each semiconductor contact region.

Moreover, the X-ray detector can include a semiconductor passivation layer of the first or the second conductivity type, which is lattice-matched to the absorption region, and has an energy gap which differs from the first energy gap of the semiconductor contact regions.

The semiconductor passivation layer can be arranged in regions on the upper side of the absorption region and has a minimum distance of at least 2 µm or at least 10 µm or at least 20 µm or at least 40 µm with respect to each highly doped semiconductor contact region along the upper side of the absorption region.

A further example provides that the absorption region has the first conductivity type or the second conductivity type, and the III-V semiconductor pixel X-ray detector additionally includes a semiconductor contact layer of the first conductivity type arranged beneath the underside of the absorption region and above the metallic front side connecting contact.

The semiconductor contact layer can have a dopant concentration of at least $1 \cdot 10^{17}$ cm$^{-3}$ and a layer thickness of 0.5 µm to 150 µm or 0.5 µm to 50 µm or 0.5 µm to 10 µm or 0.5 µm to 5 µm.

The minimum distance of the semiconductor passivation layer with respect to each highly doped semiconductor contact region can be no more than one layer thickness of the absorption region.

It is understood that the X-ray detector is designed to detect, in particular, X-rays striking the underside.

The absorption region and the semiconductor passivation layer as well as the semiconductor contact layer, if present, are preferably epitaxially produced. The layers are preferably grown consecutively on a growth substrate.

A GaAs substrate or a Ge substrate, for example, is suitable as the growth substrate, e.g. including an InGaAs layer having approximately 1 percent In to compensate for a lattice constant difference between germanium and gallium arsenide. In another specific embodiment, the growth substrate comprises a substrate layer as well as a buffer layer.

The buffer layer is used to compensate for a difference between the lattice constants of the substrate and active epitaxial layers. To grow GaAs layers on a Ge substrate, an InGaAs buffer layer is used, for example, which has an incrementally or continuously changing In fraction.

The growth substrate, i.e., for example, the GaAs substrate or the Ge substrate and/or a buffer layer, is subsequently removed, preferably entirely or possibly only partially, by grinding and/or etching and/or other processes, such as detachment.

For example, the Ge substrate is removed in a first step, the buffer layer being used as an etch stopping layer, and the buffer layer then being removed from the photonic GaAs component with the aid of a further etching process, e.g. by wet chemical etching in each case.

Alternatively, the growth substrate or the growth substrate as well as the buffer layer is/are removed with the aid of a combined grinding process and subsequent etching process. The majority of the material removal may be carried out with the aid of grinding.

An additional etch stopping layer can be inserted beneath the absorption region or, if present, beneath the semiconductor contact layer during a manufacturing process of the stacked III-V semiconductor component.

The etch stopping layer can be generated, for example, between the absorption region and a buffer layer or a substrate layer or between the semiconductor contact layer and a buffer layer or a substrate layer or between a buffer layer and a substrate layer.

The etch stopping layer ensures a highly controlled detachment of the substrate layer and/or the buffer layer or only the substrate layer with the aid of an etching process, for example wet chemical etching.

In particular, the etch stopping layer makes it possible to remove a substrate and/or buffer layer, possibly entirely without a mechanical grinding process and in a highly controlled manner. Alternatively, the large share of the substrate is removed by grinding and the remainder by wet chemical etching up to the etch stopping layer.

The etch stopping layer itself may then also be removed. The etch stopping layer has a significant chemical anisotropy with respect to the adjacent layers, i.e. the etching rate for the etch stopping layer and the subsequent layer differ by a factor of at least 10.

The etch stopping layer is usually made up of GaInP or AlGaAs, and the surrounding layers are made up of GaAs or GaInAs. The removed layers are no longer present in the final component.

Alternatively to the complete removal of the growth substrate, the growth substrate, e.g. a GaAs substrate doped with the second conductivity type, is only partially removed, so that a remaining thin layer of highly doped semiconductor contact layer forms.

The semiconductor contact regions can be designed as trough-shaped regions extending into the absorption region and produced, for example, by an implantation.

The semiconductor contact regions can also each be designed as a mesa structure. The mesa structures are preferably arranged above the upper side of the absorption region and produced, for example, with the aid of at least one mask process as well as with the aid of etching and deposition processes.

The mesa structures can be arranged on the absorption region.

The mesa structures can each be formed on an intermediate layer, the particular intermediate layers spacing the particular semiconductor contact regions at a distance from the common absorption region.

It is also understood that only the semiconductor regions of the X-ray detector, i.e. in particular the absorption region, the semiconductor contact region and the semiconductor passivation layer of the X-ray detector as well as the semiconductor contact layer, if present, are made up of III-V materials, for example GaAs, InGaP, InGaAs, AlGaAs or InP, or comprise the aforementioned III-V materials.

The X-ray detector can include only III-V semiconductor layers. In one refinement, all semiconductor regions comprise GaAs or InGaAs or are made up of GaAs or InGaAs.

The X-ray detector can include additional semiconductor layers made from other semiconductor materials or additional layers made from other non-semiconductor materials, for example a nitride layer and/or an oxide layer and/or an oxynitride layer and/or a polyimide layer as further passivation layers.

It should be noted that the expression, "made up of" can be understood to be a compound made from the specified substances without any further III-V elements, while dopants, such as zinc or silicon or tin or carbon, and also possibly impurities and also defects, are included. For example, "made up of GaAs" consequently means that gallium and arsenic, but not In or Al or P, etc., are exclusively incorporated as III-V elements.

The expression "comprises" correspondingly means that the specified III-V elements, for example GaAs, are included, and other III-V elements, such as phosphorous, aluminum or indium, may be included in addition to possible dopants and/or impurities and/or defects.

The metallic connecting contacts can be made up of one or multiple metal layers, e.g. layers comprising Au and/or Ag and/or Pb and/or Ge.

The metallic front side connecting contact can be provided with a planar or finger-shaped or dot-shaped design, it being noted that a, for example, planar front side connecting contact covering the underside of the absorption region in a layered manner has a preferably limited layer thickness, in particular a layer thickness of 5 nm to 2 µm or 10 nm to 1 µm, to keep an absorption of X-rays low.

The front side connecting contact can be integrally connected to the underside of the absorption region or, if present, integrally connected to the underside of the semiconductor contact layer.

Alternatively, the front side connecting contact is integrally connected to a further semiconductor layer arranged between the front side connecting contact and the absorption region.

The further semiconductor layer is, for example, a highly doped semiconductor contact layer having layer thicknesses between 1 µm and 50 µm or between 1 µm and 20 µm.

It should be noted that the matrix-like X-ray detector preferably has a circular or quadrangular, in particular rectangular or square, circumference, a separation preferably taking place by sawing.

It is further understood that the first conductivity type is n and the second conductivity type is p, or that the first conductivity type is p and the second conductivity type is n.

The III-V semiconductor pixel X-ray detector is thus designed as an n-on-p or as a p-on-n structure.

The minimum distance of the semiconductor passivation layer, together with the semiconductor passivation layer itself, is used to suppress leakage currents.

Due to the existing distance between the passivation layer and the semiconductor contact region, only particularly low blocking currents of less than 1 µA occur even at high blocking voltages above 400 V. In particular, the blocking currents are in a range between 0.5 nA and 50 nA or below 100 nA.

The minimum distance with respect to the semiconductor layers can be at least 50% or at least 75% of the layer thickness of the absorption region.

The advantages of the semiconductor detector according to the invention are a particularly low blocking current and a high breakdown voltage. In particular, the breakdown characteristic has a nearly ideal profile. The particularly low blocking current permits the application of high reverse voltages, whereby a very high sensitivity is reached.

The breakdown voltage can also be determined by the minimum distance between the semiconductor passivation layer and the semiconductor contact regions. The X-ray detector according to the invention makes it possible to achieve disruptive field strengths of up to 40 V/µm and extremely reliable disruptive field strengths of more than 30 V/µm.

III-V materials, in particular GaAs, additionally permit a particularly sensitive or efficient detection of X-rays, in particular low-energy X-rays, due to a high charge carrier mobility.

An advantage of the X-ray detector according to the invention is therefore the great sensitivity, whereby a reduction of the necessary dose to which a patient, for example, must be exposed, is possible.

Due to the high mobility of the charge carriers, only a very short time per image recording is likewise needed, which results in a low radiation exposure. Moreover, the high charge carrier mobility allows color X-rays to be taken, based on photon counting.

The component according to the invention is also able to be manufactured in comparatively few process steps and thereby relatively cost-effectively or at least at reasonable cost.

An intermediate layer of the second conductivity type can be formed in each case between the absorption region and each semiconductor contact region, the semiconductor passivation layer having the minimum distance with respect to each intermediate layer along the upper side of the absorption region.

If the semiconductor contact layer is present beneath the absorption region, in another refinement an intermediate layer of the first conductivity type is formed between the absorption region and the semiconductor contact layer.

The intermediate layers each preferably can have a lower dopant concentration than the adjacent semiconductor contact region, i.e. the semiconductor contact region or the semiconductor layer.

The intermediate layers are each also preferably produced in the same way as the semiconductor contact region or the semiconductor contact layer, i.e. for example by implantation or as a mesa structure by deposition and etching processes or as an epitaxial layer.

It is understood that the intermediate layers do not exclude each other. The III-V semiconductor pixel X-ray detector may include one of the two intermediate layers or both of the intermediate layers.

The absorption region can have a dopant concentration of $8 \cdot 10^{11}$ to $1 \cdot 10^{14}$ cm$^{-3}$, i.e. a low doping, and/or a layer thickness of 80 μm to 2000 μm or 500 μm to 2000 μm or 900 μm to 2000 μm.

With the particularly deep absorption region for absorption and the particularly high blocking voltage, due to the spaced-apart semiconductor passivation layer, the semiconductor structure according to the invention is suable for detecting radiation.

The semiconductor contact regions each can have a dopant concentration of at least $5 \cdot 10^{18}$ cm$^{-3}$, i.e. they are highly doped.

The minimum distance can be at least 50 μm or at least 100 μm or at least 1000 μm.

The semiconductor contact regions each can have a distance from center to center of at least 20 μm or at least 50 μm.

It is understood that the distance of the semiconductor contact regions predefine the pixel spacing or pixel pitch. The distance is preferably adjusted to an evaluation unit, in particular to be able to be connected to a corresponding evaluation unit with the aid of flip chip technology.

The semiconductor passivation layer can have a layer thickness of 0.1 μm to 1 μm. The semiconductor passivation layer also comprises a compound made from InGaP and/or AlGaAs and/or InGaAsP or is made up of AlGaAs or InGaP or InGaAsP.

The semiconductor passivation layer can surround the semiconductor contact regions or at least some of the semiconductor contact regions, completely in each case, in a projection perpendicular to the upper side of the absorption region.

The semiconductor contact regions and the absorption region can each include GaAs or are made up of GaAs.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
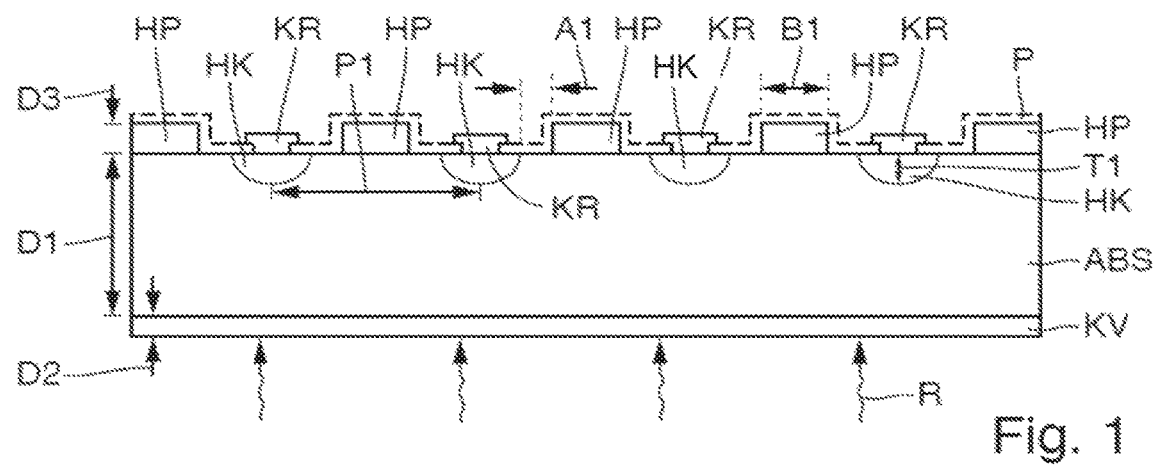
FIG. 1 shows a cross-section of a first specific embodiment of a III-V semiconductor pixel X-ray generator.

The illustration in FIG. 1 shows a cross-section of a first specific embodiment according to the invention of a III-V semiconductor pixel X-ray detector for detecting X-rays R.

The X-ray detector has a matrix of four by four III-V semiconductor pixels. It should be noted that, in a specific embodiment which is not illustrated, the array has three by three III-V semiconductor pixels. It is understood that, in another specific embodiment which is not illustrated, the X-ray detector has more than sixteen III-V semiconductor pixels.

The semiconductor pixels comprise a common absorption region ABS, including an underside, an upper side and a layer thickness D1, as well as a common front side connecting contact KV, the front side connecting contact being designed as a metal layer having a preferably limited layer thickness D2, and the underside of absorption region ABS being covered and integrally connected to the underside of absorption region ABS.

Each semiconductor pixel also comprises a semiconductor contact region HK, semiconductor contact regions HK each extending from an upper side into absorption region ABS in a trough-shaped manner up to a depth T1. Adjacent semiconductor contact regions HK have a distance P1 from center to center, distance P1 corresponding to the pixel pitch or pixel spacing.

Between semiconductor contact regions HK, a semiconductor passivation layer HP having a layer thickness D3 is arranged on the upper side of absorption region ABS in each case, semiconductor passivation layer HP being integrally connected to the upper side of absorption region ABS and having a minimum distance A1 of at least 2 μm with respect to each of the semiconductor contact regions.

An upper side of semiconductor passivation layer HP as well as a subarea of the upper side of absorption region ABS situated between semiconductor passivation layer HP and semiconductor contact region HK and an edge region of semiconductor contact regions HK adjacent to the upper side of the absorption region in each case are optionally covered by a further passivation layer P, e.g. a thin silicon nitride or oxide layer (shown by the dashed line).

A rear side connecting contact KR is arranged on the upper side of each semiconductor contact region HK, each rear side connecting contact KR also extending over an adjacent area of further passivation layer P, if further passivation layer P is present, and being integrally connected to the particular upper side of semiconductor contact region HK and possibly further passivation layer P.

Figure 2:
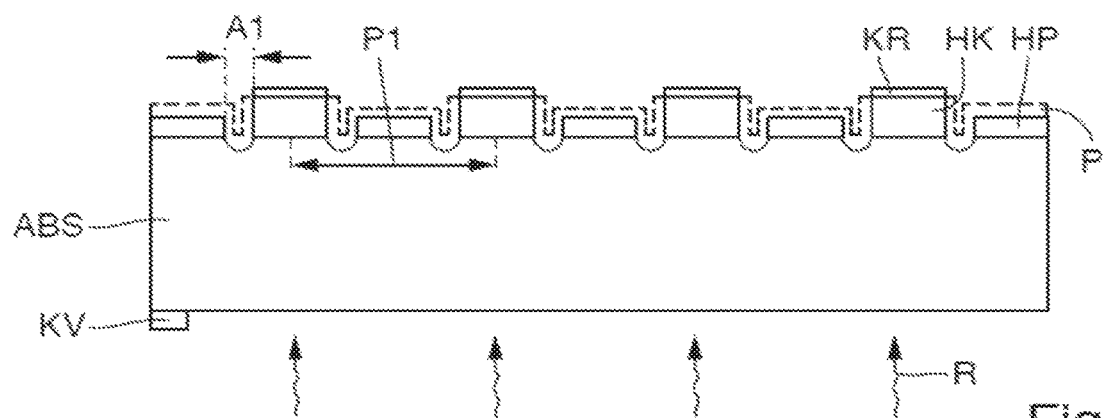
FIG. 2 shows a cross-section of an example embodiment of the III-V semiconductor pixel X-ray generator.

Another specific embodiment is shown in the illustration in FIG. 2. Only the differences from the illustration in FIG. 1 are explained below.

Semiconductor contact regions HK are each arranged as a mesa structure on a particular subarea of the upper side of absorption region ABS, rear side connecting contacts KR each being formed in a planar manner on an upper side of the particular mesa structure.

The X-ray detector does not have a further passivation layer P. Common rear side connecting contact KR is formed in a single-point manner or only on a small subarea of the underside of absorption region ABS.

Figure 3:
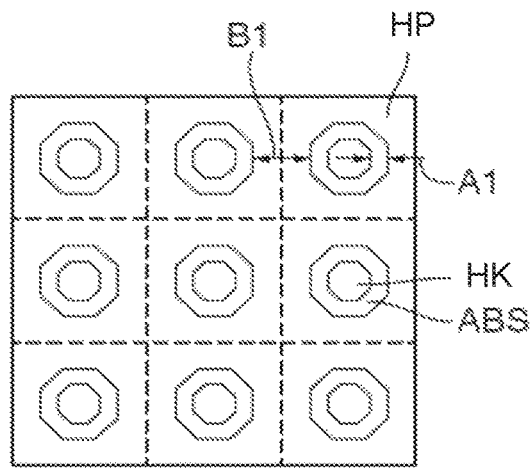
FIG. 3 shows a top view of an example embodiment of the III-V semiconductor pixel X-ray generator.

A further specific embodiment of the X-ray detector is shown in the illustration in FIG. 3.

The X-ray detector includes three by three III-V semiconductor pixels, each pixel having a semiconductor contact region HK designed as a mesa structure, including an octagonal circumference and an upper side covered by particular rear side connecting contact KR.

Semiconductor passivation layer HP completely surrounds each semiconductor contact region HK within minimum distance A1, so that a subarea of the upper side of the absorption region is exposed around each semiconductor contact region HK.

Figure 4:
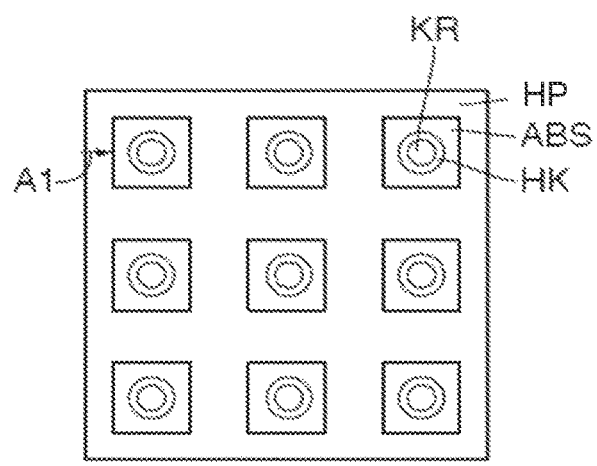
FIG. 4 shows a top view of an example embodiment of the III-V semiconductor pixel X-ray generator.

A top view of a further specific embodiment is shown in the illustration in FIG. 4. Only the differences from the illustration in FIG. 3 are explained below.

Semiconductor contact regions HK are each formed by implantation in a trough-shaped manner and having a circular upper side in shared absorption region ABS. Rear side connecting contacts KR also have a circular circumference.

Semiconductor passivation layer HP has a square recess in the area of each semiconductor contact region HK, the edge of the recess always having at least a minimum distance A1 with respect to the particular semiconductor contact region.

Figure 5:
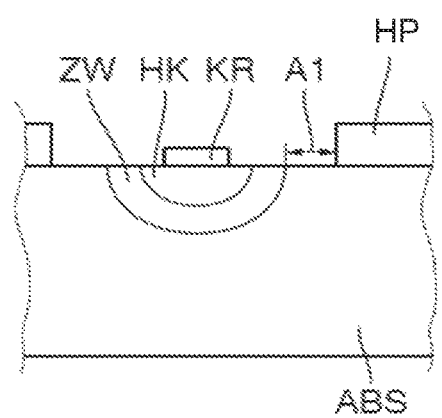
FIG. 5 shows a cross-section of an example embodiment of a III-V semiconductor pixel of the X-ray generator.

A further specific embodiment of a detail of a III-V semiconductor pixel X-ray detector is shown in the illustration in FIG. 5. Only the differences from the illustration in FIG. 1 are explained below.

The III-V semiconductor pixel X-ray detector includes an intermediate layer ZW between each semiconductor contact region HK and common absorption region ABS, the intermediate layer having a conductivity type matching the semiconductor contact regions and a lower dopant concentration compared to the dopant concentration of the semiconductor contact regions.

Semiconductor passivation layer HP has minimum distance A1 with respect to intermediate layer ZW along the upper side of the absorption region.

Rear side connecting contacts KR are each formed on a subarea of the upper side of particular semiconductor contact region HK. The X-ray detector does not have a further passivation layer P.

Figure 6:
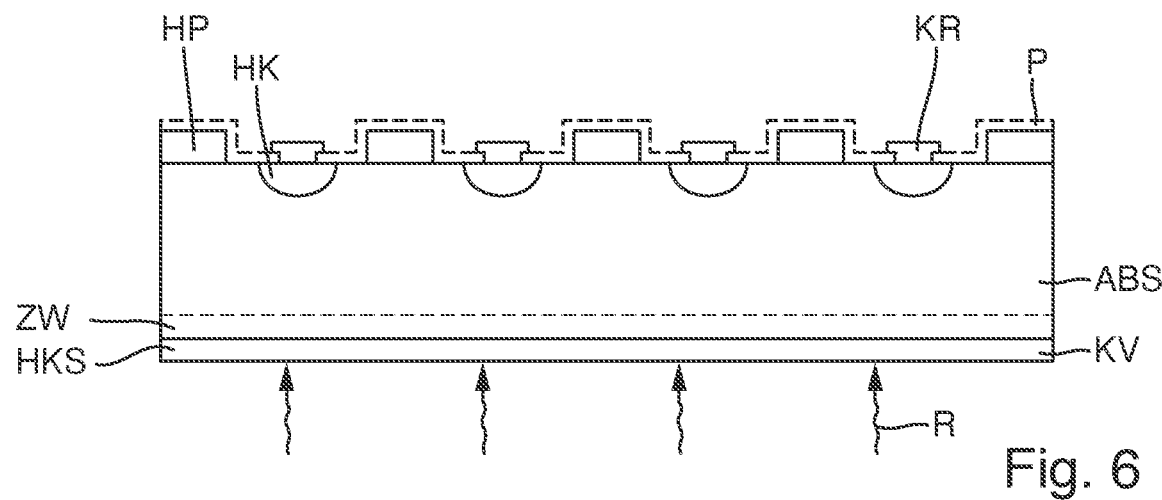
FIG. 6 shows a cross-section of an example embodiment of the III-V semiconductor pixel X-ray generator.

A further specific embodiment of a detail of a III-V semiconductor pixel X-ray detector is shows in the illustration in FIG. 6. Only the differences from the illustration in FIG. 1 or the illustration in FIG. 2 are explained below.

The III-V semiconductor pixel X-ray detector includes a highly doped semiconductor contact layer HKS of the first conductivity type between absorption region ABS and front side connecting contact KV, an upper side of semiconductor contact layer HKS being integrally connected to the underside of absorption region ABS, and an underside being integrally connected to front side connecting contact KV.

An intermediate layer ZW of the first conductivity type is optionally arranged between semiconductor contact layer HKS and the absorption region (drawn as a dashed line in each case), the upper side of semiconductor contact layer HKS being integrally connected to intermediate layer ZW, and intermediate layer ZW having a lower dopant concentration than semiconductor contact layer HKS.

Figure 7:
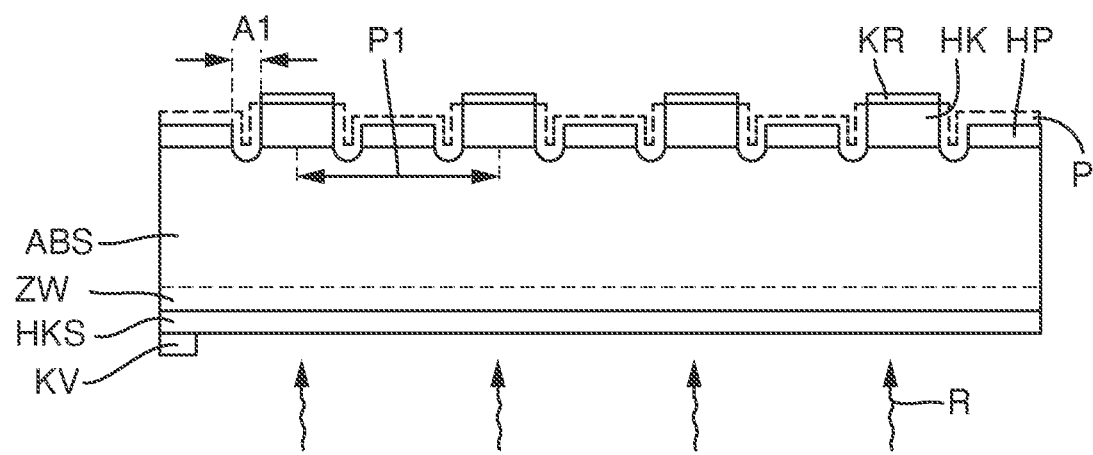
FIG. 7 shows a cross-section of an example embodiment of the III-V semiconductor pixel X-ray generator.

In the exemplary embodiments in FIGS. 6 and 7, absorption region ABS has either the first or the second conductivity type, so that the p-n junction is formed either between semiconductor contact regions HK and the absorption region or between semiconductor contact layer HKS and the absorption region.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A III-V semiconductor pixel X-ray detector, comprising:
   an absorption region of a first conductivity type, having an upper side and an underside;
   at least nine semiconductor contact regions of a second conductivity type and having a first energy gap arranged in a matrix along the upper side of the absorption region;
   a metallic front side connecting contact being arranged beneath the underside of the absorption region;
   a metallic rear side connecting contact being arranged above each semiconductor contact region; and
   a semiconductor passivation layer of the first or the second conductivity type and having a second energy gap which differs from the first energy gap,
   wherein the semiconductor passivation layer and the absorption region are lattice-matched to each other,
   wherein the semiconductor passivation layer is arranged in regions on the upper side of the absorption region, and
   wherein the semiconductor passivation layer has a minimum distance of at least 2 µm with respect to each semiconductor contact region along the upper side of the absorption region.

2. The III-V semiconductor pixel X-ray detector according to claim 1, wherein an intermediate layer of the second conductivity type is formed between the absorption region and each semiconductor contact region, the semiconductor passivation layer having the minimum distance with respect to each intermediate layer along the upper side of the absorption region.

3. The III-V semiconductor pixel X-ray detector according to claim 2, wherein the intermediate layer has a lower dopant concentration than at least nine semiconductor contact regions.

4. The III-V semiconductor pixel X-ray detector according to claim 1, wherein the absorption region has a dopant concentration of $8 \cdot 10^{11}$ to $1 \cdot 10^{14}$ cm$^{-3}$, and/or a layer thickness from 80 µm to 2000 µm.

5. The III-V semiconductor pixel X-ray detector according to claim 1, wherein the semiconductor contact regions each have a dopant concentration of at least $5 \cdot 10^{18}$ cm$^{-3}$.

6. The III-V semiconductor pixel X-ray detector according to claim 1, wherein the semiconductor contact regions each extend in a trough-shaped manner into the absorption region.

7. The III-V semiconductor pixel X-ray detector according to claim 1, wherein the semiconductor contact regions are each arranged as a mesa structure above the upper side of the absorption region.

8. The III-V semiconductor pixel X-ray detector according to claim 1, wherein the minimum distance is at least 50 µm.

9. The III-V semiconductor pixel X-ray detector according to claim 1, wherein the semiconductor contact regions each have a distance from center to center of at least 20 µm.

10. The III-V semiconductor pixel X-ray detector according to claim 1, wherein the semiconductor passivation layer has a layer thickness of 0.1 µm to 1 µm.

11. The III-V semiconductor pixel X-ray detector according to claim 1, wherein the semiconductor passivation layer includes InGaP and/or AlGaAs and/or InGaAsP or is made up of InGaP or AlGaAs or InGaAsP.

12. The III-V semiconductor pixel X-ray detector according to claim 1, wherein the semiconductor passivation layer surrounds the semiconductor contact regions or at least some of the semiconductor contact regions, completely in each case, in a projection substantially perpendicular to the upper side of the absorption region.

13. The III-V semiconductor pixel X-ray detector according to claim 1, wherein a dopant concentration of the absorption region is less than a dopant concentration of the at least nine semiconductor contact regions.

14. The III-V semiconductor pixel X-ray detector according to claim 1, wherein the semiconductor passivation layer is of the second conductivity type.

15. A III-V semiconductor pixel X-ray detector, further comprising:
   an absorption region of a first or a second conductivity type, having an upper side and an underside;
   at least nine semiconductor contact regions of the second conductivity type and having a first energy gap arranged in a matrix along the upper side of the absorption region;
   a semiconductor contact layer of the first conductivity type, the semiconductor contact layer being arranged beneath the underside of the absorption region;
   a metallic front side connecting contact being arranged beneath an underside of the semiconductor contact layer;
   a metallic rear side connecting contact being arranged above each semiconductor contact region;
   a semiconductor passivation layer of the first or the second conductivity type and having a second energy gap which differs from the first energy gap,
   wherein the semiconductor passivation layer and the absorption region are lattice-matched to each other,
   wherein the semiconductor passivation layer is arranged in regions on the upper side of the absorption region, and
   wherein the semiconductor passivation layer has a minimum distance of at least 2 µm with respect to each semiconductor contact region along the upper side of the absorption region.

16. The III-V semiconductor pixel X-ray detector according to claim 15, wherein the semiconductor contact layer has a dopant concentration of at least $1 \cdot 10^{17}$ cm$^{-3}$ and a layer thickness from 0.5 µm to 150 µm.

17. The III-V semiconductor pixel X-ray detector according to claim 16, wherein an intermediate layer of the first conductivity type is formed between the absorption region and the semiconductor contact layer.

18. The III-V semiconductor pixel X-ray detector according to claim 16, wherein the semiconductor contact regions and the absorption region and, if present, the semiconductor contact layer each include GaAs or are each made up of GaAs.

19. The III-V semiconductor pixel X-ray detector according to claim 15, wherein a dopant concentration of the absorption region is less than a dopant concentration of the at least nine semiconductor contact regions.

20. The III-V semiconductor pixel X-ray detector according to claim 15, wherein the absorption region and the semiconductor passivation layer are of opposite conductivity types.

* * * * *